(12) United States Patent
Nelson et al.

(10) Patent No.: US 12,462,983 B2
(45) Date of Patent: Nov. 4, 2025

(54) EMBEDDABLE SEMICONDUCTOR-BASED CAPACITOR

(71) Applicant: KYOCERA AVX Components Corporation, Fountain Inn, SC (US)

(72) Inventors: Cory Nelson, Simpsonville, SC (US); Jeff Borgman, Myrtle Beach, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 846 days.

(21) Appl. No.: 17/740,417

(22) Filed: May 10, 2022

(65) Prior Publication Data

US 2022/0367733 A1    Nov. 17, 2022

Related U.S. Application Data

(60) Provisional application No. 63/188,528, filed on May 14, 2021.

(51) Int. Cl.
| | |
|---|---|
| *H01G 4/005* | (2006.01) |
| *H01G 4/12* | (2006.01) |
| *H01G 4/252* | (2006.01) |
| *H01G 4/33* | (2006.01) |
| *H05K 1/18* | (2006.01) |

(52) U.S. Cl.
CPC .............. *H01G 4/33* (2013.01); *H01G 4/005* (2013.01); *H01G 4/1272* (2013.01); *H01G 4/252* (2013.01); *H05K 1/185* (2013.01)

(58) Field of Classification Search
CPC ...... H01G 4/005; H01G 4/1272; H01G 4/252; H01G 4/33; H10D 1/66
See application file for complete search history.

(56) References Cited

U.S. PATENT DOCUMENTS

| | | |
|---|---|---|
| 5,390,072 A | 2/1995 | Anderson et al. |
| 8,039,759 B2 | 10/2011 | Lee et al. |

(Continued)

OTHER PUBLICATIONS

Product Information—Metal Oxide Semiconductor (MOS) Capacitors—MS Series (https://www.kyocera-avx.com/products/passive-micro-components-pmc/discrete-thin-film-capacitors/mos-capacitors/), accessed on Feb. 28, 2023, 3 pages.

(Continued)

*Primary Examiner* — Nathan Milakovich
(74) *Attorney, Agent, or Firm* — Dority & Manning, P.A.

(57) ABSTRACT

A semiconductor-based capacitor can include a substrate including a semiconductor material, an oxide layer formed over the substrate, a conductive layer formed over at least a portion of the oxide layer, a plurality of distinct coplanar upper terminals, and a lower terminal. The upper terminals and the lower terminal can be exposed along the top and bottom surfaces of the substrate, respectively, for embedding the capacitor in a substrate such as a circuit board. The semiconductor-based capacitor can be sufficiently miniaturized to be embeddable within a circuit board while providing superior capacitance values without compromising the integrity of the capacitor. For example, each of the upper terminals can have a maximum width and a thickness normal to the maximum width, and a ratio of the width to the thickness can be greater than about 80:1 to prevent physical damage to the capacitor from warping or cracking.

20 Claims, 4 Drawing Sheets

(56) References Cited

U.S. PATENT DOCUMENTS

| | | | |
|---|---|---|---|
| 8,830,691 B2 | 9/2014 | Inagaki et al. | |
| 9,941,054 B2 | 4/2018 | Sankman et al. | |
| 10,957,807 B2 | 3/2021 | Kotru et al. | |
| 2013/0319740 A1 | 12/2013 | Sato et al. | |
| 2014/0076492 A1 | 3/2014 | Lai et al. | |
| 2018/0308997 A1* | 10/2018 | Kotru | G01J 1/0219 |
| 2020/0402720 A1 | 12/2020 | Marin et al. | |
| 2022/0059290 A1* | 2/2022 | Matsubara | H01G 4/30 |
| 2022/0352391 A1* | 11/2022 | Nelson | H01G 4/33 |
| 2022/0367732 A1* | 11/2022 | Nelson | H10D 1/692 |
| 2024/0381537 A1* | 11/2024 | Nelson | H05K 1/162 |

OTHER PUBLICATIONS

International Search Report and Written Opinion for PCT/US2022/028497 dated Aug. 30, 2022, 12 pages.

\* cited by examiner

EMBEDDABLE SEMICONDUCTOR-BASED CAPACITOR

RELATED APPLICATIONS

The present application claims priority to U.S. Provisional Application Ser. No. 63/188,528, filed on May 14, 2021, which is incorporated herein in its entirety by reference thereto.

BACKGROUND OF THE INVENTION

Semiconductor-based capacitors can provide a variety of benefits, such as temperature stability, generally high breakdown voltages, and low leakage currents. Thus, semiconductor-based capacitors may be desirable for use in a wide variety of applications, particularly those applications in which reliability when subjected to substantial mechanical and/or environmental stress is desired or necessary. However, existing semiconductor-based capacitors are generally surface-mounted and take up valuable surface area when mounted to a substrate such as a printed circuit board.

Miniaturization is one of the key design issues faced by a wide range of the latest electronic devices. Electronic device designers are challenged to use every single square millimeter of a printed circuit board (PCB). Until relatively recently, only one side of the PCB could be populated by electronic components, then as technology was improved both sides of the PCB could be used. The embedding of electronic components inside the PCB is a next logical step and direction in miniaturization evolution.

However, existing semiconductor-based capacitors are typically "flip-chip" mounted and have two terminals on a single surface of the chip. "Flip-chip" mounted capacitors can take up increased surface area in an electronic component because the terminals are generally coplanar, so both terminals take up space in a length direction and a width direction to couple to a component such as a circuit board. This mounting arrangement may not be desirable when embedding a capacitor within a circuit board, for instance, because of the increased surface area that the capacitor may take up by requiring connections with the two coplanar terminals to form the capacitor.

Moreover, various applications of electronic components, such as military, aerospace, and industrial applications, require reliability of the electronic components while subjecting the components to mechanical and environmental stress. Through-hole mounting, e.g., drilling holes and securing component leads axially or radially through a PCB, has previously been used in these applications to ensure reliability of the connections between electronic components under increased mechanical and/or environmental stress. However, through-hole mounting may generally not be used for semiconductor-based capacitors, e.g., thin-film capacitors, as the process of drilling holes can compromise the integrity of the capacitor by causing physical damage to the chip such as cracking or warping.

Thus, a need currently exists for a semiconductor-based capacitor that is sufficiently miniaturized to be embedded within a substrate, such as a printed circuit board, and includes reliable connections between electronic components.

SUMMARY OF THE INVENTION

In accordance with one embodiment of the present disclosure, an embeddable capacitor can include a substrate including a semiconductor material, a conductive layer formed over the substrate, and an intervening layer between the substrate and the conductive layer. The intervening layer can include one or more of an oxide layer and an insulator layer. The capacitor can include a plurality of distinct coplanar upper terminals formed over the conductive layer, and a lower terminal formed over a lower surface of the substrate opposite the top surface of the substrate. Each of the plurality of distinct coplanar upper terminals can have a maximum width, a surface area, and a thickness normal to the maximum width. A ratio of the maximum width to the thickness can be greater than about 80:1. A ratio of a cumulative surface area of the upper terminals to a surface area of the substrate can be in a range from about 0.6:1 to about 0.99:1.

In accordance with another embodiment of the present disclosure, a circuit board can include a substrate that defines a mounting surface, and a recessed opening can be provided in the mounting surface. The circuit board can include a capacitor embedded within the recessed opening. The capacitor can include a semiconductor substrate, a plurality of distinct coplanar upper terminals formed over a top surface of the semiconductor substrate, and at least one lower terminal formed over a bottom surface of the semiconductor substrate opposite the top surface of the substrate. Each of the plurality of distinct coplanar upper terminals can have a maximum width, a surface area, and a thickness normal to the maximum width. A ratio of the maximum width to the thickness can be greater than about 80:1.

In accordance with another embodiment of the present disclosure, a method of embedding a capacitor in a substrate can include: providing a substrate, wherein the substrate comprises a recessed opening in a surface of the substrate; providing a capacitor; inserting the capacitor within the recessed opening; and electrically connecting the substrate with at least one of the upper terminals of the capacitor. The capacitor can include: a semiconductor substrate; a plurality of distinct coplanar upper terminals formed over a top surface of the semiconductor substrate; at least one lower terminal formed over a bottom surface of the semiconductor substrate opposite the top surface of the substrate. Each of the plurality of distinct coplanar upper terminals can have a maximum width, a surface area, and a thickness normal to the maximum width. A ratio of the maximum width to the thickness can be greater than about 80:1.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which.

Figure 1:
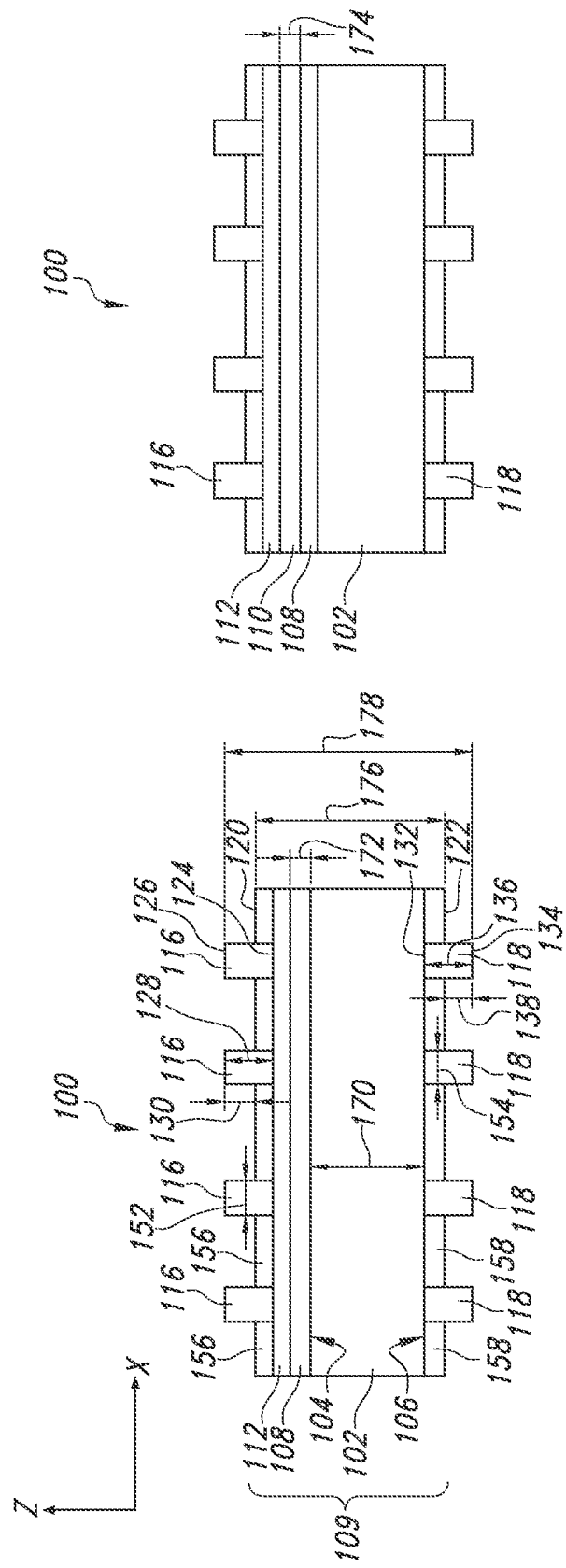
FIG. 1A is a side cutaway view of a capacitor according to aspects the present disclosure.
FIG. 1B is a side cutaway view of another embodiment of a capacitor according to aspects of the present disclosure.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a metal-oxide-semiconductor (MOS) capacitor configured for being embedded into a substrate, such as a circuit board and having discrete upper terminals configured for electrically coupling the capacitor to the substrate. For instance, the discrete upper terminals can be configured for laser drilling vias through the terminals to electrically couple a substrate and/or one or more electronic components with the capacitor, without compromising the integrity or function of the capacitor.

The capacitor can include a plurality of distinct coplanar upper terminals formed over the conductive layer. The plurality of distinct coplanar upper terminals can be coupled to the conductive layer. At least one lower terminal can be formed over a bottom surface of the substrate opposite the top surface of the substrate. Each of the upper terminals and the at least one lower terminal can be exposed for mounting the capacitor. For example, the capacitor can be configured for embedding into a substrate such as a printed circuit board.

Each of the plurality of distinct coplanar upper terminals can have a maximum width and a thickness normal to the maximum width. A ratio of the width to the thickness can be greater than about 80:1, such as greater than 200:1, such as greater than 500:1.

A ratio of a cumulative surface area of the upper terminals to a total surface area of the substrate can be greater than about 0.6:1, such as greater than about 0.7:1, such as greater than 0.75:1. The ratio of the cumulative surface area of all of the upper terminals to a surface area of the substrate can be less than 1:1 (i.e., the cumulative surface area of the upper terminals can be equal to or less than the surface area of the substrate). As used herein, the term "cumulative surface area of the upper terminals" means the total surface area of each of the upper terminals added together.

In some aspects of the invention, as the ratio of the width to the thickness of the upper terminals increases (i.e., having wider upper terminals with reduced thickness), the ratio of the cumulative surface area of the upper terminals to the surface area of the substrate also increases. Likewise, as the thickness of the upper terminals increases and the ratio of the width to the thickness of the upper terminals decreases, the cumulative surface area of the upper terminals may decrease as well. In particular, the interplay between the thickness of the upper terminals, the width of the upper terminals, and the cumulative surface area of the upper terminals can be critical to reducing the risk of causing physical damage to the chip, such as warping or cracking, due to localized stress on the chip from the discrete upper terminals.

The capacitor chip can have an overall thickness in a range from about 100 microns to about 160 microns, such as from about 110 microns to about 155 microns, such as from about 120 microns to about 150 microns.

The capacitor chip can have a length extending in a first direction and a width extending in a second direction perpendicular to the first direction. The length and the width can each be less than 1750 microns, such as less than 1000 microns, such as less than 500 microns. The length and width can each be greater than 250 microns, such as greater than 350 microns, such as greater than 500 microns. The capacitor chip can have a surface area of less than 3 $mm^2$, such as less than 1 $mm^2$, such as less than 0.5 $mm^2$, and greater than 0.05 $mm^2$, such as greater than 0.1 $mm^2$, such as greater than 0.25 $mm^2$.

Further, a ratio of the length to the width can be in a range from about 3:1 to about 1:3, such as from about 2:1 to 1:2, for example 1:1. For instance, a ratio of the length to width of about 1:1 can represent a capacitor having a generally square shape.

Meanwhile, depending on the area of the capacitor chip, as described above, as well as additional factors including the dielectric constant and properties of the materials used to form the capacitor, the capacitor can maintain a capacitance value in a range between about 0.1 pF and about 1800 pF, such as from about 1 pF to about 1500 pF, for instance from about 10 pF to about 1000 pF.

As one skilled in the art would readily appreciate and as described in further detail below, the capacitance can be determined by multiplying a capacitance per unit area of the capacitor by a surface area of the capacitor. The capacitance per unit area can be calculated by the dielectric constant multiplied by the permittivity of free space divided by the dielectric thickness, i.e., capacitance is inversely related to the thickness of the dielectric. Thus, the capacitance value can be augmented by either changing the thickness of the dielectric, changing the surface area of the capacitor, or a combination thereof. The dielectric thickness in the present invention can be in a range from about 100 nm to about 5000 nm, such as from about 500 nm to about 3000 nm, such as from about 1000 nm to about 2000 nm.

Moreover, as will be described in further detail below, the capacitor of the present invention can further include both an insulator layer and an oxide layer formed between the electrode layers. When the additional insulator layer is present, the capacitance value can increase as compared to a capacitor without the insulator layer. For instance, a ratio of the capacitance value without an insulator layer to capacitance value with the insulator layer can be about 1:1.5. In other words, providing the capacitor of the present invention with an additional insulator layer between the electrodes can increase the capacitance value by about one and a half times.

The capacitor can include a substrate including a semiconductor material, such as silicon, gallium arsenide, germanium, silicon carbide, strontium titanate, and/or mixtures thereof. The substrate can be doped with one or more suitable dopants, such as boron, arsenic, phosphorus, gallium, aluminum, indium, and antimony. The substrate can be formed as a monolithic substrate having a top surface and a bottom surface. The surfaces, e.g., top surface and bottom surface, of the substrate can generally be smooth. For example, the surfaces of the substrate can be free of pores, trenches, or the like. The substrate can have a pair of end surfaces that are perpendicular (normal) to the top surface and bottom surface of the monolithic substrate. The substrate can further have a pair of side surfaces that are perpendicular (normal) to the top and bottom surfaces of the monolithic substrate, and perpendicular (normal) to the end surfaces. The pair of end surfaces and the pair of side surfaces can be free of terminations, including the terminals.

As used herein, the term "generally," e.g., "generally smooth" or "generally equal", does not necessarily mean that a characteristic is exactly or perfectly smooth or equal, and may allow a small difference if the respective layers are uniformly connected to adjacent layers within the capacitor and/or when mounted to a substrate such as a circuit board.

As used herein, a first layer that is "formed over" a second layer may refer to the first layer being arranged over the second layer with respect to a thickness direction (i.e., the z-direction) of the monolithic substrate. The first layer may be directly in contact with the second layer. However, intermediate layers may also be formed therebetween such that the first layer and second layer do not directly contact each other.

The capacitor can include an oxide layer formed over a top surface of the substrate. The oxide layer can be or include oxides of the semiconductor materials described herein. For instance, the substrate can be a silicon semiconductor substrate and the oxide layer can be or include silicon oxide. In some embodiments, the oxide layer can be grown in situ on the top surface of the substrate such that the oxide layer is in direct contact with the top surface of the substrate. The oxide layer can have a generally uniform thickness on the surface of the oxide layer. For example, the average thickness of the oxide layer can vary less than 20% across the oxide layer, in some embodiments less than 10%, and in some embodiments less than 5%. Lithography (e.g., photolithography) techniques can be used to define the shape of the oxide layer, if desired. For instance, portions of the oxide layer can be removed through etching such that the oxide layer is shaped as desired.

The capacitor can include a conductive layer formed over at least a portion of the oxide layer. The conductive layer can be contained within a perimeter of the oxide layer. The conductive layer can be free of direct contact and/or direct electrical connection with the substrate. The conductive layer can be or include metal, such as copper, gold, aluminum, silver, nickel, or mixtures thereof.

The capacitor can optionally further include an insulator layer formed over the oxide layer. The insulator layer can be an intervening layer between the conductive layer and the oxide layer. The insulator layer can be or include silicon nitride and/or other electrically insulating materials described herein. The insulator layer can have a generally uniform thickness on the surface of the oxide layer. For example, the average thickness of the oxide layer can vary less than 20% across the insulator layer, in some embodiments less than 10%, and in some embodiments less than 5%. By providing an insulator layer formed over the oxide layer, the reliability of the capacitor can be substantially improved. Specifically, any potential defects, e.g., pores, in the oxide layer and/or in the insulator layer are unlikely to be aligned in the z-direction. For instance, the insulator layer may cover or fill in any defects, holes or imperfections in the surface of the oxide layer. As a result, forming the insulator layer over the oxide layer can significantly reduce the likelihood that the capacitor will short-circuit. Thus, as described above, the capacitance value of the capacitor can be increased by providing the insulator layer formed over the oxide layer. For instance, the capacitance value may be increased by up to one and a half times when the insulator is formed over the oxide layer.

The capacitor of the present invention can be formed as a thin-film capacitor, i.e., having one or more thin-film layers. For instance, the conductive layer, the oxide layer, and the insulator layer can each be formed as a thin-film layer, respectively. The thin-film components may be formed of a variety of suitable materials. The thin-film capacitor may include one or more conductive layers. The conductive layer(s) may include a variety of suitable conductive materials. Example conductive materials include copper, nickel, gold, tin, lead, palladium, silver, and alloys thereof. Any conductive metallic or non-metallic material that is suitable for thin-film fabrication may be used, however.

The layers of thin-film component(s) may have thicknesses that are about 50 micrometers or less, in some embodiments 20 micrometers or less, in some embodiments 10 micrometers or less, and in some embodiments 5 micrometers or less. For example, in some embodiments the thickness of the thin-film components may range from about 0.025 micrometers to about 50 micrometers, in some embodiments from about 0.1 micrometers to about 20 micrometers, in some embodiments from about 0.3 micrometer to about 10 micrometers, in some embodiments from about 1 micrometer to about 5 micrometers.

The thin-film components may be precisely formed using a variety of suitable subtractive, semi-additive, or fully additive processes. For example, physical vapor deposition and/or chemical deposition may be used. For instance, in some embodiments, the thin-film components may be formed using sputtering, a type of physical vapor deposition. A variety of other suitable processes may be used, however, including plasma-enhanced chemical vapor deposition (PECVD), electroless plating, and electroplating, for example. Lithography masks and etching may be used to produce the desired shape of the thin-film components. A variety of suitable etching techniques may be used including dry etching using a plasma of a reactive or non-reactive gas (e.g., argon, nitrogen, oxygen, chlorine, boron trichloride) and/or wet etching.

In some embodiments, the capacitor may include a first, e.g., lower, protective layer exposed along a bottom surface of the coupler and/or a second, e.g., upper, protective layer exposed along a top surface of the coupler. For example, the lower protective layer may be formed over the lower surface of the substrate. In some embodiments, the upper protective layer may be formed over the conductive layer. The first protective layer and/or second protective layer may include a layer of a polymeric material (e.g., polyimide), SiNO, $Al_2O_3$, $SiO_2$, $Si_3N_4$, benzocyclobutene (BCB), or glass. In one particular embodiment, the protective layer can include BCB. The lower protective layer and/or upper protective layer may have thicknesses that range from about 1 micron to about 50 microns, in some embodiments from about 5 microns to about 40 microns, and in some embodiments from about 10 microns to about 30 microns.

The capacitor can include a plurality of upper terminals formed over the conductive layer. For instance, the upper terminals can be coupled to the conductive layer, e.g., directly contacting with the conductive layer. The upper terminals can be contained within a perimeter of the conductive layer.

As used herein, the term "plurality" means at least two or more. For instance, the plurality of upper terminals can include at least two, at least four, at least six, at least eight, or at least ten or more upper terminals. The plurality of upper terminals can include any integer value from two (2) to fifty (50). For instance, as described in further detail below and shown in FIG. 2, in one embodiment the plurality of upper terminals can include 16 upper terminals.

The plurality of upper terminals can be formed from distinct, coplanar three-dimensional structures. The three-dimensional structures can be described as pillars, bumps, studs, columns, or the like. The upper terminals can be formed from a conductive metal, such as copper, gold or aluminum. For instance, the upper terminals can be formed by plating. The upper terminals can have a thickness in the z-direction in a range from about 1 micron to about 10 microns, such as from about 2 microns to about 8 microns, such as from about 3 microns to about 7 microns. In one particular embodiment, the upper terminals can have a thickness in a range from about 5 to 7 microns.

When connecting the capacitor to a substrate, e.g., embedding the capacitor in a circuit board, the upper terminals can be laser drilled to provide connectivity in a variety of known means without sacrificing integrity of the capacitor.

The capacitor can further include one or more lower terminals formed over the bottom surface of the substrate. The lower terminal(s) can be contained within a perimeter of the substrate. The lower terminal(s) can be formed as a single layer of material or as a plurality of distinct, coplanar three-dimensional structures. The lower terminal(s) can be formed from a conductive metal, such as copper, gold or aluminum. For instance, the lower terminal(s) can be formed by plating. The lower terminal(s) can provide connectivity in a variety of known means without sacrificing integrity of the capacitor.

In some embodiments, the capacitor can include a plurality of distinct, coplanar lower terminals aligned in the first direction (e.g., x-direction) and the second direction (e.g., y-direction) with the plurality of distinct, coplanar upper terminals.

The capacitor can further include an upper protective layer formed over the conductive layer and a lower protective layer formed over the bottom surface of the substrate, as described above. Each of the plurality of upper terminals can extend through the upper protective layer in a vertical direction normal to the top surface of the substrate. The at least one lower terminal can extend through the lower protective layer in a vertical direction normal to the lower surface of the substrate. The terminals can be exposed through the protective layer(s) for electrical connection when mounting the capacitor.

In some aspects of the present invention, the upper terminals and the lower terminal(s) can be formed from copper, such as by copper plating. Typically, solid copper may not be a suitable material for forming exposed terminations of an electronic component because copper is susceptible to oxidizing when exposed. As such, solder material such as an alloy of copper, tin and gold is often used to form electrical terminations for electronic components such as capacitors. However, the present inventors have found that forming the upper and lower terminals of the embeddable capacitor from copper, e.g., by plating solid copper over the conductive layer to form the upper terminals and/or over the bottom surface of the semiconductor substrate for the lower terminal(s), can provide superior electrical connections without the risk of oxidizing when the capacitor is embedded within a substrate. For instance, the upper and lower terminals can be laser drilled to form direct electrical connections with the circuit board and/or additional electronic components mounted to the circuit board, as will be described in further detail below.

The capacitor can be configured for being embedded within a printed circuit board. The upper terminals and one or more lower terminals can be exposed along the top surface and bottom surface and contained within a perimeter of the top surface and bottom surface, respectively, of the monolithic substrate.

The present invention is further directed to a circuit board, such as a printed circuit board. The circuit board can be formed from any suitable material such as FR4, polytetrafluoroethylene, or the like. One or more electronic components, such as capacitors, resistors, transistors, switches, and/or other electronic components can be mounted to the circuit board. As used herein, "mounted to" the circuit board can include any type of connection to the circuit board that provides electrical connectivity, such as surface mounting to a surface of the circuit board, embedding within the circuit board, or the like.

The circuit board can have a recessed opening in a mounting surface of the circuit board, such as an upper surface or a lower surface. The recessed opening can be configured to receive an electric component to be embedded within the circuit board. For instance, a capacitor can be inserted within the recessed opening for embedding within the circuit board. One or more electrically conductive terminations of the capacitor can be coupled to the circuit board. For instance, one or more vias can be formed in, on or through the terminations to electrically connect the capacitor with one or more conductive traces of the circuit board and/or one or more electronic components that are mounted to the circuit board.

A method of embedding a capacitor in a substrate, e.g., a circuit board, can include steps of: providing a substrate, such as a circuit board, that includes a recessed opening in a surface of the substrate; providing a capacitor; inserting the capacitor within the recessed opening; and electrically connecting the substrate with at least one of the terminals of the capacitor. The capacitor can include a semiconductor substrate; a plurality of distinct coplanar upper terminals formed over a top surface of the semiconductor substrate; and at least one lower terminal formed over a bottom surface of the semiconductor substrate opposite the top surface of the substrate, and wherein each of the plurality of distinct coplanar upper terminals has a maximum width, a surface area, and a thickness normal to the maximum width, wherein a ratio of the maximum width to the thickness is greater than about 80:1 and a ratio of a cumulative surface area of all the upper terminals to a surface area of the substrate is in a range from about 0.6:1 to about 0.99:1. One or more layers of a protective material can be inserted or applied within the recessed opening after the insertion of the capacitor. For instance, one or more layers of protective material can surround the exposed upper terminals of the capacitor. In such an embodiment, the upper terminals can be protected from being exposed to air.

FIG. 1A is a perspective view of a capacitor 100 according to aspects the present disclosure. As described in further detail below, the capacitor 100 may be embeddable, e.g., the capacitor 100 may be embedded into a substrate such as a printed circuit board. The capacitor 100 can include a substrate 102 including a semiconductor material, such as silicon. The substrate 102 can have an upper surface 104 and a lower surface 106. The capacitor 100 can include an oxide layer 108 formed on a surface, e.g., the upper surface 104, of the substrate 102. The oxide layer 108 can be formed from silicon oxide ($SiO_2$). The capacitor 100 can include an upper conductive layer 112 formed over at least a portion of the oxide layer 104. The upper conductive layer 112 can be free of direct contact and/or direct electrical connection with the substrate 102.

Figure 2:
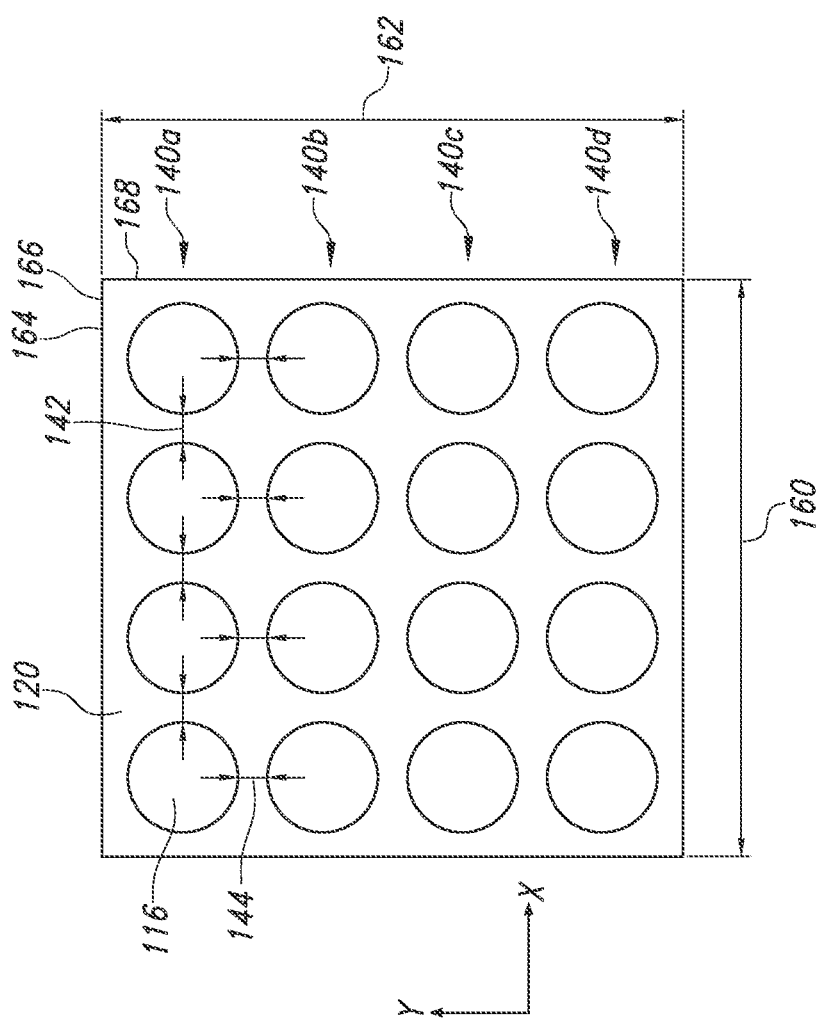
FIG. 2 illustrates a top-down view of the capacitor of FIG. 1A and the capacitor of FIG. 1B.

A plurality of upper terminals 116 can be formed over the upper conductive layer 112 of the capacitor 100. Each upper terminal 116 can be formed from any suitable conductive material, such as copper, gold, or aluminum. In some embodiments, as shown in FIGS. 1A-B and 2, the upper terminals 116 are formed from pillar bumps 116. The pillar bumps 116 can comprise copper (Cu). One or more lower terminals 118 can be formed over the lower surface 106 of the substrate 102. Each lower terminal 118 can be formed from any suitable conductive material, such as copper, gold, or aluminum. In some embodiments, as shown in FIGS. 1A-B and 2, a plurality of lower terminals 118 are formed from pillar bumps 118. The pillar bumps 118 can comprise copper (Cu). Each of the plurality of upper terminals 116 can be exposed along the upper surface 120 of the capacitor 100, and the one or more lower terminals 118 can be exposed along the lower surface 122 of the capacitor 100, for embedding the capacitor 100.

An upper protective layer 156 can be formed over the upper conductive layer 112 of the capacitor 100. The upper protective layer 156 may form an upper surface 120 of the capacitor 100 in the Z-direction. As illustrated in FIGS. 1A-B, the upper protective layer 156 can surround the upper terminals 116, and the upper terminals 116 can extend above or through the upper protective layer 156. In other words, the upper protective layer 156 may not cover the exposed surfaces 126 of the upper terminals 116. The upper protective layer 156 can comprise any suitable protective material. For instance, the upper protective layer 156 can be formed from benzocyclobutene (BCB).

A lower protective layer 158 can be formed over the lower surface 106 of the substrate 102. The lower protective layer 158 can form a lower surface 122 of the capacitor 100 in the Z-direction. As illustrated in FIGS. 1A-B, the lower protective layer 158 can surround the one or more lower terminals 118, and the one or more lower terminals 118 can extend beyond or through the lower protective layer 158. In other words, the lower protective layer 158 may not cover the exposed surfaces 134 of the one or more lower terminals 118.

As shown in FIG. 1B, in some aspects of the invention, the capacitor 100 can further include an insulator layer 110 formed over the oxide layer 108. The insulator layer 110 can be formed from any suitable insulator material. In some embodiments, the insulator layer 110 is formed from silicon nitride (SiN). The upper conductive layer 112 can be formed over the insulator layer 110 such that the insulator layer 110 is disposed between the oxide layer 108 and the upper conductive layer 112.

As illustrated in FIGS. 1A-B, a chip 109 can be formed from the substrate 102, oxide layer 108, upper conductive layer 112, protective layers 156 and 158, and optionally the insulator layer 110. The upper terminals 116 and the one or more lower terminals 118 can be coupled to the chip 109.

Each upper terminal 116 can be coupled to the upper conductive layer 112 for direct electrical connection with the upper conductive layer 112. Each upper terminal 116 can have a contact surface 124 coupled to the upper conductive layer 112 and an exposed surface 126 opposite the contact surface 124. Each upper terminal 116 can have a thickness 128 extending in the Z-direction from the contact surface 124 to the exposed surface 126. Each upper terminal 116 can have an exposed thickness 130 extending from the upper surface 120 of the capacitor 100 to the exposed surface 126 of the upper terminal 116. The upper terminals 116 can be configured for being laser drilled to provide connectivity with the capacitor 100 in a variety of known means without sacrificing the integrity (e.g., physical structure, electrical properties, etc.) of the capacitor 100.

As shown in FIG. 2, the planar configuration or shape of each upper terminal 116 can be substantially circular (circle-shaped); however, the present invention contemplates any suitable planar shape having rounded corners or edges. Each upper terminal 116 can have a maximum width 152 in the X-direction. The maximum width 152 can be generally the same or equal, as shown in FIG. 2, or some or all of the upper terminals 116 can have a different width 152 than other upper terminals 116.

As shown in FIGS. 1A-B and 2, each of the plurality of upper terminals 116 can be distinct from each other. Additionally, each of the plurality of upper terminals 116 can be coplanar with each other. For instance, the contact surface 124 of each upper terminal 116 can be coplanar with each other, e.g., in a plane formed by the upper conductive layer 112. The thickness 128 of each upper terminal 116 can be generally equal. In a configuration as shown in FIGS. 1A-B in which the contact surfaces 124 of each upper terminal 116 are coplanar and the thickness 128 of each upper terminal 116 is generally equal, the exposed surfaces 126 of each upper terminal 116 can be generally coplanar.

The one or more lower terminals 118 can be coupled to the lower surface 106 of the substrate 102 for direct electrical connection with the substrate 102. The at least one lower terminal 118 can include a plurality of lower terminals 118. Each lower terminal 118 can have a contact surface 132 coupled to the surface 106 of the substrate 102 and an exposed surface 134 opposite the contact surface 132. Each lower terminal 118 can have a thickness 136 extending in the Z-direction from the contact surface 132 to the exposed surface 134. Each lower terminal 118 can have an exposed thickness 138 extending from the lower surface 122 of the capacitor 100 to the exposed surface 134 of the lower terminal 118. The one or more lower terminals 118 can be configured for being laser drilled to provide connectivity with the capacitor 100 in a variety of known means without sacrificing the integrity (e.g., physical structure, electrical properties, etc.) of the capacitor 100.

As shown in FIG. 2, the planar configuration or shape of each lower terminal 118 can be substantially circular (circle-shaped); however, the present invention contemplates any suitable planar shape having rounded corners or edges. Each lower terminal 118 can have a maximum width 154 in the X-direction. The maximum width 154 can be generally the same or equal, or some or all of the lower terminals 118 can have a different width 154 than other lower terminals 118.

As shown in FIGS. 1A-B and 2, in the configuration having a plurality of lower terminals 118, each of the plurality of lower terminals 118 can be distinct from each other. Additionally, each of the plurality of lower terminals 118 can be coplanar with each other. For instance, the contact surface 132 of each lower terminal 118 can be coplanar with each other, e.g., in a plane formed by the lower surface 106 of the substrate 102. The thickness 136 of each lower terminal 118 can be generally equal. In a configuration as shown in FIGS. 1A-B in which the contact surfaces 132 of each lower terminal 118 are coplanar and the thickness 136 of each lower terminal 118 is generally equal, the exposed surfaces 134 of each lower terminal 118 can be generally coplanar.

The plurality of upper terminals 116 can be spaced apart from each other in an X-direction and a Y-direction that is perpendicular to the X-direction. The plurality of upper terminals 116 can be arranged in a geometric pattern, e.g., in one or more rows 140. Each of the plurality of upper terminals 116 in a first row 140a, second row 140b, third row 140c, fourth row 140d, etc., can be spaced apart a distance 142 in the X-direction. Each of the plurality of upper terminals 116 in a row 140, e.g., row 140a, can be spaced apart a distance 144 in the Y-direction from an upper terminal 116 in an adjacent row, e.g., row 140b. The plurality of upper terminals 116 can be generally evenly spaced in the X-direction and in the Y-direction perpendicular to the X-direction.

When the at least one lower terminal 118 includes a plurality of lower terminals 118, the plurality of lower terminals 118 can be spaced apart from each other in an X-direction and a Y-direction that is perpendicular to the X-direction. The plurality of lower terminals 118 can be arranged in a geometric pattern, e.g., in one or more rows 146. Each of the plurality of lower terminals 118 in a first row 146a, second row 146b, third row 146c, fourth row 146d, etc., can be spaced apart a distance 148 in the X-direction. Each of the plurality of lower terminals 118 in a row 146, e.g., row 146a, can be spaced apart a distance 150 in the Y-direction from a lower terminal 118 in an adjacent row, e.g., row 146b. The plurality of lower terminals 118 can be generally evenly spaced in the X-direction and in the Y-direction perpendicular to the X-direction.

As shown in FIGS. 1A-B, a plurality of lower terminals 118 may be generally aligned in the vertical Z-direction with the plurality of upper terminals 116. For instance, the first row 140a of upper terminals 116 may be aligned in the Z-direction with the first row 146a of lower terminals 118. However, it is to be understood that the upper terminals 116 and the one or more lower terminal(s) 118 can be arranged in any suitable configuration, and are not required to be identically aligned in the Z-direction as shown. The plurality of lower terminals 118 can have the same planar shape as the upper terminals 116, e.g., a generally circular shape. Moreover, the plurality of lower terminals 118 each can have a maximum width 154 in the X-direction that is generally the same as a maximum width 152 of the upper terminals 116. In the embodiments shown in FIGS. 1A-B, the lower terminals 118 and the upper terminals 116 can have a substantially identical configuration with respect to the X-axis and the Y-axis.

As described above, the upper terminals 116 and the one or more lower terminal(s) 118 can comprise copper (Cu). For instance, the upper terminals 116 and the one or more lower terminals 118 can be formed by copper plating. As described above, the upper terminals 116 can have a thickness 128 extending from the contact surface 124 to the exposed surface 126. The thickness 128 of the upper terminals 116 can be in a range from about 1 micron to about 7 microns, for instance, from about 5 microns to about 7 microns. The thickness 128 of the upper terminals 116 should be generally uniform such that the contact surfaces 124 of the upper terminals 116 are generally planar, as described above. Substantial variation in the thickness 128 of each of the upper terminals 116 can cause the capacitor 100 to fail to connect to a substrate, e.g., a printed circuit board, uniformly, which can cause a failure in electrical connection between the capacitor 100 and the substrate. Moreover, substantial variation in the thickness 128 of each of the upper terminals can locally concentrate stress on the substrate 102, which can cause physical damage such as warping or cracking of the chip 109. Physical damage to the chip 109 can decrease the reliability in electrically connecting the capacitor 100 with a substrate such as a printed circuit board.

A ratio of the width 152 of the upper terminals 116 to the thickness 128 of the upper terminals 116 can be in a range from about 50:1 (e.g., having an increased thickness 128 in relation to the width 152) to about 1000:1 (e.g., having a significantly reduced thickness 128 in relation to the width 152). The ratio of the width 152 to the thickness 128 can have an impact on the concentration of stress on the chip 109 caused by the upper terminals 116. For instance, when the ratio of the width 152 to the thickness 128 is high, the upper terminals 116 may generate less stress on the chip 109 because the upper terminals 116 may each be spread out over a larger area on the chip 109. By reducing the local concentration of stress on the chip 109, which can cause physical damage to the chip 109 such as cracking or warping, the capacitor 100 can have improved reliability and functionality.

The chip 109 can have a width 160 extending in the X-direction and a length 162 extending in the Y-direction perpendicular to the X-direction. The substrate 102 can have a perimeter 164 that can span the width 160 and length 162 of the chip 109. The oxide layer 108 can have a perimeter 166 that is contained within the perimeter 164 of the substrate 102. When present, the insulator layer 110 can have a perimeter 168 that may be generally equal to the perimeter 166 of the oxide layer 108. The upper terminals 116 can be formed over the oxide layer 108 and contained within the perimeter 166 of the oxide layer 108 and/or the insulator layer 110 and contained within the perimeter 168 of the insulator layer 110. The one or more lower terminals 118 can be formed over the lower surface 106 of the substrate 102 and contained within the perimeter 164 of the substrate 102.

The substrate 102 can have a thickness 170 extending from the upper surface 104 to the lower surface 106 in the Z-direction. The oxide layer 108 can have a thickness 172 extending in the Z-direction. The insulator layer 110, when present, can have a thickness 174 extending in the Z-direction. The chip 109 can have an overall thickness 176 extending from the upper surface 120 to the lower surface 122. The thickness 176 can be in a range from about 100 microns to about 250 microns.

The width 160 and length 162 of the capacitor 100, together with the thickness 172 of the oxide layer 108, can determine the capacitance value of the capacitor 100. The thickness 172 of the oxide layer 108 can be selected for improved electrical performance of the capacitor 100. For instance, for a capacitor 100 having a given width 160 and length 162, the thickness 172 of the oxide layer 108 can be varied to alter the capacitance value. For example, as the thickness 172 of the oxide layer 108 increases, the capacitance value of the capacitor 100 can decrease. Moreover, as the thickness 172 of the oxide layer 108 increases, the breakdown voltage (BDV) of the capacitor 100 can increase. The thickness 172 of the oxide layer 108 can be in a range from about 100 nm to about 5000 nm, such as from about 500 nm to about 3000 nm, such as from about 1000 nm to about 2000 nm.

The width 160 of the chip 109 can be in a range from about 250 microns to about 1750 microns. The length 162 of the chip 109 can be in a range from about 250 microns to about 1750 microns. A ratio of the width 160 to the length 162 can be in a range from about 3:1 to about 1:3. For instance, a capacitor 100 having a width 160 and a length 162 having a ratio of about 1:1 can have a generally square shape. When the ratio of width 160 to length 162 exceeds about 3:1, or the ratio of length 162 to width 160 exceeds about 3:1, uneven stress can be locally concentrated on the chip 109 which can cause physical damage such as warping or cracking. Physical damage to the chip 109 such as warping or cracking can decrease the reliability in electrically connecting the capacitor 100 with a substrate such as a printed circuit board.

The chip 109 can have a surface area determined by the length 162 and width 160 (e.g., length×width). As described above, each upper terminal 116 can have a contact surface 124, which can have a surface area determined by its maximum width 152 (e.g., diameter). The total cumulative surface area of all of the upper terminals 116 can be less than the surface area of the chip 109. For instance, a ratio of the cumulative surface area of the upper terminals 116 to the surface area of the chip 109 can be in a range from about 0.6:1 to about 0.99:1. The ratio of the cumulative surface area of the upper terminals 116 to the surface area of the chip 109 can influence the amount of local stress on the chip 109. Moreover, the thickness 128 of each of the plurality of upper terminals 116 can further influence the amount of local stress on the chip 109. By reducing the local concentration of stress on the chip 109, which can cause physical damage to the chip 109 such as cracking or warping, the capacitor 100 can have improved reliability and functionality. Thus, for example, if the upper terminals 116 have an increased thickness, the maximum width 152 of the terminals and/or the cumulative surface area of the upper terminals 116 may be reduced relative to the surface area of the chip 109 in order to reduce the risk of warping, cracking, or other physical damage that can cause failure or decreased reliability of the capacitor 100.

The capacitor 100 can have a total thickness 178 in a range up to about 150 microns. By having a total thickness 178 of less than or equal to about 150 microns, the capacitor 100 can have sufficiently thin dimension to be able to be embedded into a substrate, e.g., a circuit board.

Once formed, the capacitor 100 may then be mounted to a circuit board. More specifically, the capacitor 100 can be embedded within a substrate 202 of a circuit board. In this manner, some or all of the capacitor 100 including the upper terminals 116 and the one or more lower terminals 118 become embedded within the board itself, thereby minimizing the height profile of the capacitor 100 on the board.

Figure 3:
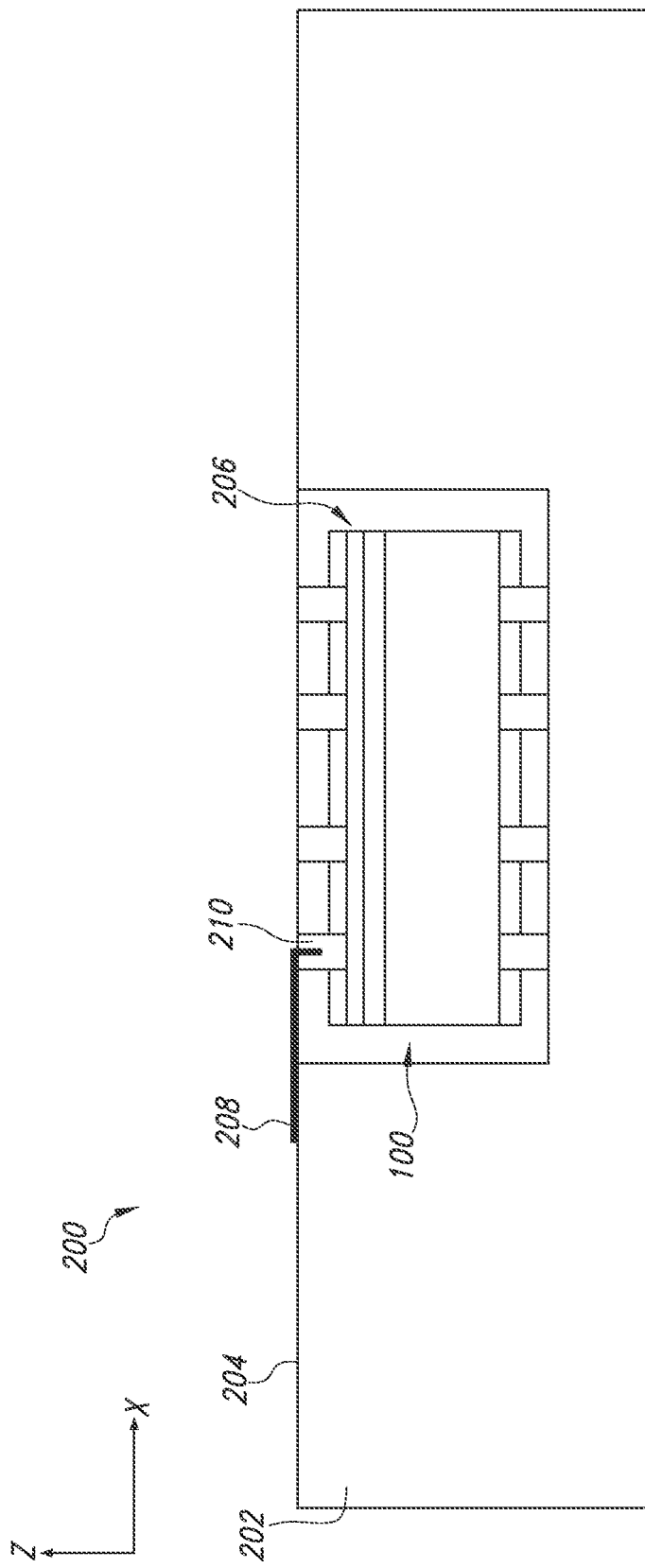
FIG. 3 is a side cut-away view of an embedded capacitor assembly including the capacitor of FIG. 1A and a mounting surface, such as a printed circuit board.

FIG. 3 illustrates an embedded capacitor assembly 200. The assembly 200 can include a substrate 202. The substrate 202 can be a printed circuit board having conductive traces 208. The printed circuit board 202 can be formed from any suitable material such as FR4, polytetrafluoroethylene, or the like. It should be understood that various other electronic components may also be mounted onto the board 202 as is well known in the art and that a single capacitor is shown only for purposes of illustration. In any event, the substrate 202 can have an upper surface 204, e.g., a mounting surface. The upper surface 204 can have an opening 206 which is recessed into the substrate 202. To minimize its height profile on the board, the capacitor 100 can be embedded within the opening 206 and attached to the substrate 202 using known techniques. For instance, one or more vias 210 can be formed in the upper terminals 116, and the vias 210 can be connected with the conductive traces 208 of the printed circuit board using known techniques.

The degree of which the capacitor 100 is embedded depends on a variety of factors, such as the thickness of the substrate 202, the depth of the opening 206, the thickness 178 of the capacitor 100, etc. The thickness of the circuit board (not including the attached electrical components) may be from about 0.1 to about 5 millimeters, in some embodiments, from about 0.2 to about 3 millimeters, and in some embodiments, from about 0.4 to about 1.5 millimeters. Thus, depending on the particular thicknesses employed, the capacitor 100 may be embedded so that the exposed surfaces 124 of the upper terminals 116 are substantially coplanar with or below the upper surface 204 of the substrate 202. For instance, the capacitor 100 can be embedded and enclosed within the opening 206 of the substrate 202, e.g., circuit board. Alternatively, the capacitor 100 may be embedded so that the exposed surfaces 124 of the upper terminals 116 extend slightly above the upper surface 204 of the substrate 202. Regardless, the height profile, i.e., thickness 178, occupied by the capacitor 100 is decreased and may be controlled depending on the desired use.

Figure 4:
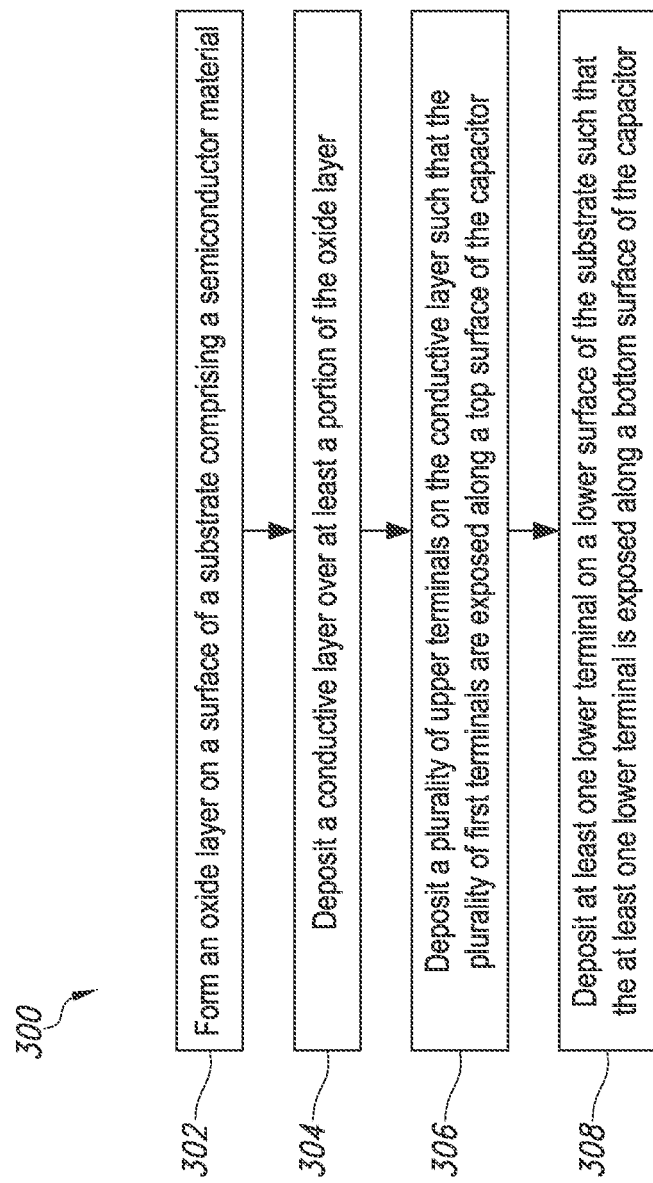
FIG. 4 is a flowchart of a method for forming a capacitor according to aspects of the present disclosure.

Referring to FIG. 4, aspects of the present disclosure are directed to a method 300 for forming a capacitor according to aspects of the present disclosure. In general, the method 300 will be described herein with reference to the capacitor 100 of FIGS. 1A and/or 1B. However, it should be appreciated that the disclosed method 300 may be implemented with any suitable capacitor. In addition, although FIG. 3 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 300 can include, at (302), forming an oxide layer 108 on a surface 104 of a substrate 102 comprising a semiconductor material. For example, the oxide layer 108 can be grown in situ on the top surface 104 of the substrate 102. Lithography (e.g., photolithography) techniques can be used to define the shape of the oxide layer 108. For instance, if desired, portions of the oxide layer 108 can be removed through etching.

The method 300 can include, at (304), depositing a conductive layer 112 over at least a portion of the oxide layer 108. The conductive layer 112 can be contained within a perimeter of the oxide layer 108. The conductive layer 112 can be free of direct contact and/or direct electrical connection with the substrate 102.

The method 300 can include, at (306), depositing a plurality of upper terminals 116 on the conductive layer 112 such that each of the plurality of upper terminals 116 are exposed along an upper surface 120 of the capacitor 100 for embedding the capacitor 100. The plurality of upper terminals 116 can be formed by plating.

The method 300 can include, at (308), depositing at least one lower terminal 118 on the bottom surface 106 of the substrate 102 such that the lower terminal(s) 118 are exposed along the bottom surface 106 of the substrate 102 for embedding the capacitor 100.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An embeddable capacitor comprising:
   a substrate comprising a semiconductor material;
   a conductive layer formed over the substrate;
   an intervening layer between the substrate and the conductive layer, wherein the intervening layer comprises one or more of an oxide layer and an insulator layer;
   a plurality of distinct coplanar upper terminals formed over the conductive layer;
   a lower terminal formed over a lower surface of the substrate opposite the top surface of the substrate;

wherein each of the plurality of distinct coplanar upper terminals has a maximum width, a surface area, and a thickness normal to the maximum width, wherein a ratio of the maximum width to the thickness is greater than about 80:1 and a ratio of a cumulative surface area of all the upper terminals to a surface area of the substrate is in a range from about 0.6:1 to about 0.99:1.

2. The capacitor of claim 1, wherein the plurality of upper terminals and the lower terminal comprise at least one of copper, gold, or aluminum.

3. The capacitor of claim 1, wherein the thickness of each of the plurality of upper terminals is at least about 1 micron.

4. The capacitor of claim 1, wherein the lower terminal comprises a plurality of distinct coplanar lower terminals.

5. The capacitor of claim 4, wherein the plurality of lower terminals are aligned with the plurality of upper terminals with respect to the first and second directions.

6. The capacitor of claim 1, wherein the intervening layer comprises both the oxide layer and the insulator layer, wherein the insulator layer is formed over the oxide layer.

7. The capacitor of claim 6, wherein the insulator layer comprises silicon nitride.

8. The capacitor of claim 1, further comprising an upper protective layer formed over the conductive layer and a lower protective layer formed over the lower surface of the substrate.

9. The capacitor of claim 8, wherein each of the plurality of upper terminals extends through the upper protective layer in a vertical direction normal to an upper surface of the substrate.

10. The capacitor of claim 1, wherein each of the plurality of upper terminals are exposed along a top surface of the capacitor.

11. The capacitor of claim 1, wherein the lower terminal is exposed along a bottom surface of the capacitor.

12. The capacitor of claim 1, wherein the semiconductor material of the substrate comprises silicon.

13. The capacitor of claim 1, wherein the oxide layer comprises silicon oxide.

14. The capacitor of claim 1, wherein the capacitor comprises a capacitance value in a range from about 0.1 pF to about 1800 pF.

15. A circuit board comprising:
a substrate that defines a mounting surface, wherein a recessed opening is provided in the mounting surface; and
a capacitor comprising:
a semiconductor substrate;
a plurality of distinct coplanar upper terminals formed over an upper surface of the semiconductor substrate;
a lower terminal formed over a lower surface of the semiconductor substrate opposite the upper surface of the substrate;
wherein each of the plurality of distinct coplanar upper terminals has a maximum width, a surface area, and a thickness normal to the maximum width, wherein a ratio of the maximum width to the thickness is greater than about 80:1 and a ratio of a cumulative surface area of all the upper terminals to a surface area of the semiconductor substrate is in a range from about 0.6:1 to about 0.99:1.

16. The circuit board of claim 15, wherein the capacitor further comprises an oxide layer formed over the upper surface of the substrate and a conductive layer formed over the oxide layer.

17. The circuit board of claim 16, wherein the plurality of upper terminals are formed over the conductive layer.

18. The circuit board of claim 16, further comprising an insulator layer formed between the oxide layer and the conductive layer.

19. The circuit board of claim 15, wherein the lower terminal comprises a plurality of distinct coplanar lower terminals.

20. A method of embedding a capacitor in a substrate comprising:
providing a substrate, wherein the substrate comprises a recessed opening in a surface of the substrate;
providing a capacitor, wherein the capacitor comprises:
a semiconductor substrate;
a plurality of distinct coplanar upper terminals formed over a top surface of the semiconductor substrate;
at least one lower terminal formed over a bottom surface of the semiconductor substrate opposite the top surface of the substrate;
wherein each of the plurality of distinct coplanar upper terminals has a maximum width, a surface area, and a thickness normal to the maximum width, wherein a ratio of the maximum width to the thickness is greater than about 80:1 and a ratio of a cumulative surface area of all the upper terminals to a surface area of the substrate is in a range from about 0.6:1 to about 0.99:1;
inserting the capacitor within the recessed opening; and
electrically connecting the substrate with at least one of the plurality of upper terminals of the capacitor.

* * * * *